Dec. 17, 1968 W. H. ELIAS 3,417,341
COMPOSITE AM-FM INTERMEDIATE FREQUENCY AMPLIFIER
Filed June 13, 1967
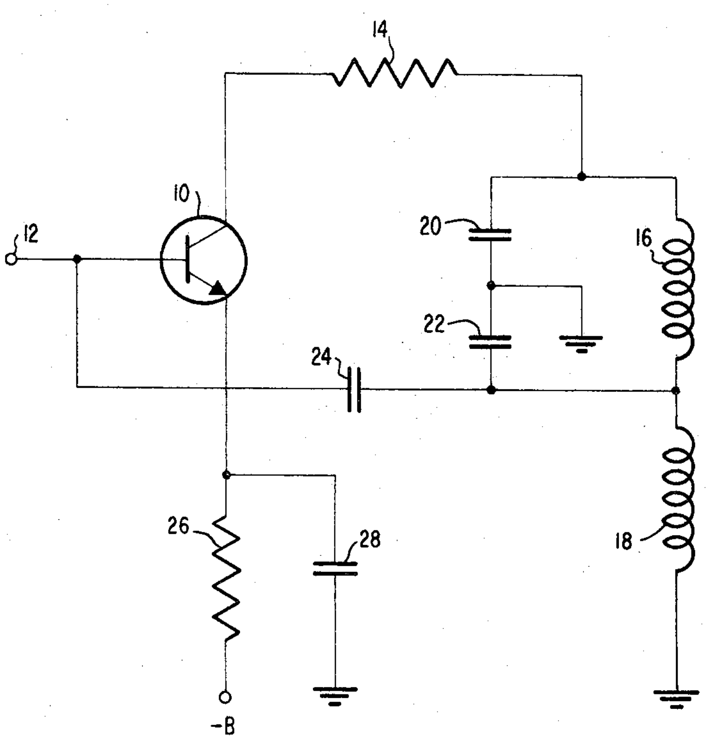
INVENTOR
WILLIAM H. ELIAS
BY Thomas A. Briody
ATTORNEY United States Patent Office 3,417,341
Patented Dec. 17, 1968

3,417,341
COMPOSITE AM-FM INTERMEDIATE FREQUENCY AMPLIFIER

William H. Elias, Decatur, Ill., assignor to General Electric Company, a corporation of New York Filed June 13, 1967, Ser. No. 645,713
3 Claims. (Cl. 330—28)

ABSTRACT OF THE DISCLOSURE

A composite IF amplifier for both AM and FM signals in which the output circuit includes a pair of series connected capacitors grounded at their junction in parallel with a first coil to tune the FM signal and in series with a second coil to tune the AM signal.

*Background of the invention*

This invention relates to a composite AM-FM intermediate frequency amplifier and particularly to such an amplifier having an improved tuned output circuit.

It has long been known that economies may be realized in AM-FM radio receivers by designing certain stages to handle both the AM and FM signals, and this approach has been used extensively in the intermediate frequency amplifier stages as exemplified in the U.S. Patent No. 3,287,644. The typical circuit arrangement, however, suffers from two main disadvantages. First of all, the parallel inductive-capacitive circuit in the amplifier output tuned to the frequency of the FM signal usually employs a tapped coil as the inductive element. Such components are relatively expensive to manufacture because the coil winding operation must be stopped at some point for the addition of the tapped connection and then re-started. Furthermore, it is very difficult to mass produce tapped coils having uniform electrical characteristics owing to the difficulty of applying the tap connection at exactly the same point on each coil. Secondly, since the tap point effectively represents ground to the high frequency FM signals, the ground path in the amplifier output circuit necessarily includes the inductance of the coil up to the tap point. This frequently results in spurious oscillations due to the inherent characteristics of the high frequency transistors used as the active elements in the amplifiers.

*Summary*

These disadvantages are overcome in accordance with the teachings of this invention by providing an improved tuned output circuit for a composite AM-FM intermediate frequency amplifier including a pair of capacitors connected in series and grounded at their junction. These capacitors are placed in parallel with a first coil to form a first tuned circuit which resonates at the intermediate frequency of the FM signal. These same capacitors are also connected in series with a second coil to form a second tuned circuit whose resonant frequency corresponds to the intermediate frequency of the AM signal. Neither of the inductance coils have any tap connections, which obviates the first disadvantage noted above, and a purely capacitive path to ground is presented by the series connected capacitors, which eliminates the second disadvantage of the prior art circuit.

*Brief description of the drawings*

The foregoing and other objects, features and advantages of the invention will be apparent from the following more particular description of a preferred embodiment of the invention, as illustrated in the accompanying drawings in which the single figure shows a schematic circuit diagram of a composite AM-FM intermediate frequency amplifier incorporating the teachings of this invention.

*Description of the preferred embodiment*

Referring now to the drawing, an input signal is applied to the base of NPN transistor 10 at terminal 12. This input signal may be derived from a previous composite IF stage, or from a tuner which would include a radio frequency amplifier, a local oscillator and a mixer. The tuner would normally be provided with a selector switch to choose either the amplitude modulated carrier waves in the AM broadcast band (540–1600 kilocycles) or frequency modulated carrier waves in the FM band (88–108 megacycles). The tuner output would provide either an intermediate frequency signal of 455 kilocycles for AM reception or an intermediate frequency signal of 10.7 megacycles for FM reception.

The collector output of the amplifier transistor 10 is coupled through a resistor 14 to one end of a first inductance coil 16 connected to ground through a second inductance coil 18. The first coil 16 is paralleled by a pair of series connected capacitors 20, 22 grounded at their central junction. The two capacitors may be replaced by a single three plate capacitor with grounded central plate, as is well known in the art. The combination of the series capacitors 20, 22 in parallel with the first coil 16 provides a first circuit tuned to the FM intermediate frequency of 10.7 megacycles while the same two capacitors in parallel with the second coil 18 provides a second circuit tuned to the AM intermediate frequency of 455 kilocycles. The lower terminals of capacitor 22 and coil 16 are connected to the base terminal of transistor 10 through a feedback path including a neutralizing capacitor 24, the feedback ratio being determined by the relative magnitudes of capacitors 20 and 22. The emitter terminal of transistor 10 is connected to a B-power supply through resistor 26 and to ground through a capacitor 28 in conventional manner. The amplifier output signals may be inductively coupled to the next stage by utilizing coils 16 and 18 as the primary windings of coupling transformers, or they may be capacitively coupled out by appropriate connections at the tops of both coils.

It may thus be seen that coils 16 and 18 are free of tap connections and therefore considerably cheaper to mass produce with more uniform electrical tolerances, which provides a great advantage over the prior art. Furthermore, the ground connection between capacitors 20 and 22 provides a purely capacitive ground path in the collector circuit of transistor 10, which suppresses the undesired oscillations that might otherwise be developed due to the high frequency transistor characteristics and inductive grounding.

While the invention has been particularly shown and described with reference to a preferred embodiment thereof, it will be understood by those skilled in the art that various changes in form and detail may be made therein without departing from the spirit and scope of the invention.

What is claimed is:

1. An output circuit for a composite AM-FM intermediate frequency amplifier including a single transistor having a base input and a collector output, comprising:

(a) first and second inductance coils connected in series at their one ends and grounded at the other end of the second inductance coil, (b) first and second capacitors connected in series and grounded at their common junction, the series capacitors being connected in parallel with the first inductance coil, and (c) means connecting the collector output of the transistor to the other end of the first inductance coil, the series capacitors in series with the first coil being tuned to the intermediate frequency of the FM signal and the series capacitors in parallel with the second coil being tuned to the intermediate frequency of an AM signal.

2. An output circuit as defined in claim 1 further comprising a neutralizing capacitor connected in a feedback relationship between the one ends of the first and second coils and the base input of the transistor.

3. An output circuit as defined in claim 2 wherein the means recited in sub-paragraph (c) of claim 1 comprises a resistor.

No references cited.

JOHN KOMINSKI, *Primary Examiner.*

U.S. Cl. X.R.

330—31, 21, 192; 325—318, 317